United States Patent [19]

Hynecek

[11] Patent Number: 4,814,648
[45] Date of Patent: Mar. 21, 1989

[54] LOW 1/F NOISE AMPLIFIER FOR CCD IMAGERS

[75] Inventor: Jaroslav Hynecek, Richardson, Tex.

[73] Assignee: Texas Instruments Incorporated, Dallas, Tex.

[21] Appl. No.: 100,668

[22] Filed: Sep. 24, 1987

[51] Int. Cl.$^4$ .................. H03K 5/22; H03K 17/16
[52] U.S. Cl. .................. 307/497; 307/355; 307/279; 307/263; 307/443; 330/253; 377/63
[58] Field of Search .......... 307/491, 493, 494, 496, 307/497, 530, 279; 377/62, 63; 330/252, 253

[56] References Cited

U.S. PATENT DOCUMENTS

| 4,007,381 | 2/1977 | Moshen | 377/63 X |
| 4,075,514 | 2/1978 | Sequin | 307/530 |
| 4,223,234 | 9/1980 | Levine | 377/63 X |
| 4,644,287 | 2/1987 | Levine | 377/63 X |

OTHER PUBLICATIONS

Weste et al., "MOST Amp for Performing ... Functions", Electronic Circuits and Systems, Sep. 1977, vol. 1, No. 5, pp. 165-172.

*Primary Examiner*—Stanley D. Miller
*Assistant Examiner*—Timothy P. Callahan
*Attorney, Agent, or Firm*—George L. Craig; James T. Comfort; Melvin Sharp

[57] ABSTRACT

A low 1/f noise amplifier has been provided for an output of a CCD imager. To reduce clock noise, the amplifier employs a differential detection scheme. Linear stages (54, 76) are coupled by capacitors (60, 82) to a differential amplifier (64). Differential amplifier (64) employs a first (112, 118) and a second (172, 198) differential transistor pair. The second differential pair (172, 198) is cross-coupled to the outputs of the first differential pair (112, 118) by load resistances (180, 206) with the voltage drop across them remaining substantially constant. To maintain stability, the positive and negative branches of the amplifier are periodically reset by a resetter (210). The input nodes (62, 86) are periodically reset to a voltage reference.

14 Claims, 2 Drawing Sheets

LOW 1/F NOISE AMPLIFIER FOR CCD IMAGERS

TECHNICAL FIELD OF THE INVENTION

This invention relates in general to CCD imager arrays and registers, and more particularly relates to on-chip output amplifiers for CCD registers.

BACKGROUND OF THE INVENTION

Certain conventional CCD imagers employ an on-chip amplifier circuit which follows a charge detection node to convert the sensed charge to an output voltage signal. These conventional designs have a CCD serial register that terminates in a detection node usually represented by a detection capacitor. The detection capacitor is in turn coupled to the first transistor of a dual source follower circuit, the sources of which are biased by constant current sources. The dual source followers serve as a buffer of the voltage that appears on the detection capacitor as a result of the charge sensed at the node and provide sufficient driving capacity for the off-chip circuitry with no additional voltage gain.

In certain applications, such as image sensors for medical endoscopes, the CCD image sensor is required to be very small, with a very small charge to be detected. The rest of the supporting circuits must be remotely located from the sensor. In applications such as these, it is desirable to first amplify and then buffer the signal on-chip to prevent interference picked up from long leads to the remotely located processing circuits.

In view of the small size of the on-chip circuits, and small available charge quantity, it is also desirable to increase the charge/voltage conversion gain. This is conventionally performed by making the capacitance of the detection capacitor as low as possible. The first transistor of the conventional dual source follower must also be made to be as small as possible to reduce its input capacitance $C_i$. A small first transistor, however, implies a large 1/f noise, i.e. a source of noise that is inversely proportional to the signal frequency. The value of the 1/f noise associated with the first transistor is inversely proportional to the gate area.

In conventional CCD imagers, on-chip gain amplifiers are usually not used. This is because the requirements for such on-chip gain amplifiers are very stringent and difficult to satisfy without overall performance degradation.

In general, a small, on-chip gain amplifier must meet the following requirements for amplifying a CCD video signal in a satisfactory manner. First, it must produce a signal gain in the range of three to five without amplification of the CCD transfer clock feedthrough signal. In CCD devices, the signal representing the amount of radiation sensed by the cell is comparable to or much smaller than the clock feedthrough signal. It is therefore necessary to amplify only the signal and not the clock feedthrough.

Second, the amplifier should have a low power consumption, with current on the order of 0.5 to 1.5 milliamperes. This is because a large power drain would generate excessive device heating and would therefore increase dark current.

Third, the amplifier must have a high frequency response. The amplifier must pass high frequencies to eliminate distortions from the clock/video waveform. Typical clock frequencies range from 1 megahertz to 10 megahertz at present, and may range up to 50 megahertz in future high density television (HDTV) applications.

Fourth, the amplifier must have a low noise so that the actual signal, which will have a relatively small amplitude, will not be lost.

Fifth, the gain of the amplifier must be fixed and must be independent of temperature and power supply variations.

Sixth, the amplifier performance must be insensitive to process variations. In particular, the location of the amplifier on-chip makes it impossible to externally adjust the amplifier bias point. Therefore, this must be provided automatically.

Seventh, it is desirable that the polarity of the amplifier output be selectable between inverting and non-inverting.

Finally, the amplifier circuit components must be compatible with the virtual phase CCD process to avoid unnecessary process complications and added manufacturing cost.

SUMMARY OF THE INVENTION

The present invention discloses and claims an on-chip output amplifier for a CCD register that meets the above requirements. According to one aspect of the invention, a low noise output amplifier for a chopped AC signal has a first stage with an input and an output, and a resetter for periodically resetting the input to a voltage reference. An AC coupling element couples the output of the first stage to an input of the second stage.

Preferably, the second stage consists of a differential arrangement having a signal input and a common mode input. In this instance, the preceding stage consists of a signal circuit for receiving a signal comprised of a differential portion and a common portion. An output of the signal circuit is coupled to the signal input of the differential amplifier through a capacitor. A common mode circuit is provided for receiving the common portion of the signal. A second AC coupling element couples an output of the common mode circuit to the common mode input of the differential stage. The resetter is operable to periodically reset the signal input and the common mode input of the differential stage to the voltage reference.

According to another aspect of the invention, a first feedback circuit connects a first output of the differential stage to the positive input thereof, and a second feedback circuit connects a second output of the differential stage to the negative input thereof.

The combination of a first stage AC-coupled to a second stage, with feedback circuits in the second stage, produces the advantage of a high-gain amplifier with low 1/f noise. Since the input is a chopped AC signal, long term stability of the circuit is not a problem. Stability of the circuit can be maintained using the resetter.

In order to further reduce noise, it is preferred that the feedback circuits be capacitive rather than resistive in nature.

According to another aspect of the invention, the second, differential stage includes a differential pair. A negative branch of the differential pair couples the negative input of the second stage to a first output thereof, and a positive branch of the differential pair couples the positive input of the second stage to a second output thereof. A first feedback circuit couples the first output back to the negative input, and a second feedback element couples the second output back to the positive input of the second stage.

Preferably, the second stage includes a second differential pair having third and fourth outputs. Like the first differential pair, the second differential pair has positive and negative circuit branches. The input of the negative circuit branch of the second differential pair is connected to the first output of the first differential pair, and the input of the positive branch of the second differential pair is coupled to the second output of the first differential pair. The positive branch of the second differential pair couples the second output of the first differential pair to the fourth output of the second differential pair. Likewise, the negative branch of the second differential pair couples a first output of the first differential pair to the third output of the second differential pair. The third output is cross-coupled back to the second output of the second stage, and the fourth output is coupled back to the first output of the second stage.

Preferably, a first load impedance couples the third output to the second output, and a second load impedance couples the fourth output to the first output.

A resetter is provided to periodically equalize the voltages at the first and second outputs of the second stage to provide stability. Preferably, the feedback circuits used to couple the first output to the negative input of the first stage and the second output to the positive input thereof are substantially noiseless AC coupling elements, such as capacitors.

According to a further aspect of the invention, the differential stages each consist of a differential transistor pair having sources connected in common to a constant current source. It is preferred that a feedback from the second differential pair be provided such that the voltage drops across the loads of the first differential pair are maintained constant. In this manner the loads have effective impedances that are very large, thus advantageously increasing the gain of the circuit. In a particularly preferred embodiment, each transistor of the differential pair in the second stage further has a buffer transistor for driving the feedback circuitry and output.

The present invention provides a principal advantage in that its differential amplifier scheme eliminates clock signal feedthrough. Another advantage is that power consumption is minimized by the use of a minimum number of amplifier stages. A further advantage is provided in that a high frequency response can be obtained by optimization of the circuit element values. Another advantage arises in that since the signal being processed is an AC signal, 1/f amplifier noise is reduced. Another advantage is provided by the use of negative feedback to reduce the noise generated inside the amplifier, which is further reduced by the use of capacitive feedback elements instead of resistors.

BRIEF DESCRIPTION OF THE DRAWINGS

Further aspects of the invention and their advantages will be discerned with reference to the following detailed description in conjunction with the appended drawings in which.

DETAILED DESCRIPTION

Figure 1:
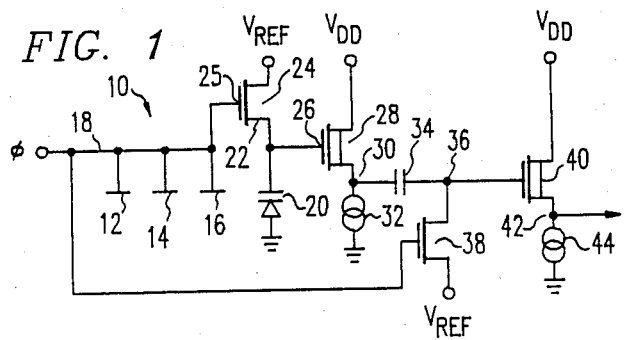
FIG. 1 is an electrical schematic diagram of a simple amplifier for a CCD output register having two AC-coupled amplifier stages and a reset mechanism.

FIG. 1 is an electrical schematic diagram of a basic amplifier circuit according to the invention. The last few stages of a virtual phase CCD output register are indicated generally at 10. Register stages 10 include serial CCD wells 12, 14 and 16, the gates of which are here shown schematically. The conductivity of the channels between wells 12-16 is controlled by the application of a pulse $\phi_s$ through a conductor 18.

Terminal well 16 is coupled to a detection node 20, here represented by a capacitor and a diode. A source 22 of a MOS resetting transistor 24 is coupled to detection node 20. The drain of resetting transistor 24 is connected to a voltage reference $V_{REF}$, and its gate 25 is controlled by pulse $\phi_s$. Node 20 will therefore be periodically reset to $V_{REF}$ by the CCD clock pulse $\phi_s$.

Node 20 is also connected to a gate 26 of a preferably buried-channel transistor 28. The drain of transistor 28 is connected to a voltage supply $V_{DD}$, and its source 30 is connected to a constant current source 32. The constant current source, which is preferably a small virtual well JFET transistor, sinks a small constant current to ground to bias transistor 28. An AC coupling element 34, such as a capacitor, couples source 30 to a node 36. Node 36 is periodically reset to a voltage reference $V_{REF}$ through the application of pulse $\phi_s$ to the gate of a second resetting transistor 38. Node 36 is further connected to the gate of a second transistor 40, which in the illustrated embodiment is of the buried-channel type. Like transistor 28, the drain of transistor 40 is connected to voltage supply $V_{DD}$ and its source 42 is connected also to a constant current source such as a virtual well JFET transistor. The signal appearing at node 42 is output on line 44 to the next amplifier stage or off-chip.

In order to maximize the charge/voltage conversion gain, it is necessary to make the capacitance $C_D$ of detection node 20 as low as possible. The input capacitance $C_i$ of transistor 28 should also be made as small as possible. This in turn indicates a small size for transistor 28. As the size of transistor 28 decreases, however, the 1/f noise associated with it will increase, since this is inversely proportional to the area of gate 26.

The 1/f noise component from gate 26 is eliminated through the use of coupling capacitor 34. Therefore, the size of input transistor 24 can be optimized without worrying about 1/f noise.

In the basic embodiment illustrated in FIG. 1, transistor 40 can be of the buried-channel type and can be large where it is provided to drive a large, off-chip load. Enlarging transistor 40 will automatically provide a good 1/f noise performance. Transistor 40 can be of the buried channel type because it is biased from the same reference source into the same low-noise operating range without hot electron effects. Since the detection node reset transistor 24 and the reset transistor 38 are clocked at the same time, the necessity for additional clock lines is eliminated.

The gain of the basic circuit shown in FIG. 1 is limited by the possible detection node conversion gain. In instances where the device is very small, such as an endoscope sensor, it is desirable to further amplify and buffer the signal on-chip to prevent interference pickup from the long leads of the remotely located processing circuits. In applications like this, therefore, it is advantageous to insert a further gain stage. Such a gain stage should amplify the signal from three to four times without a concurrent amplification of the clock feedthrough signal associated with CCD output registers.

Figure 2:
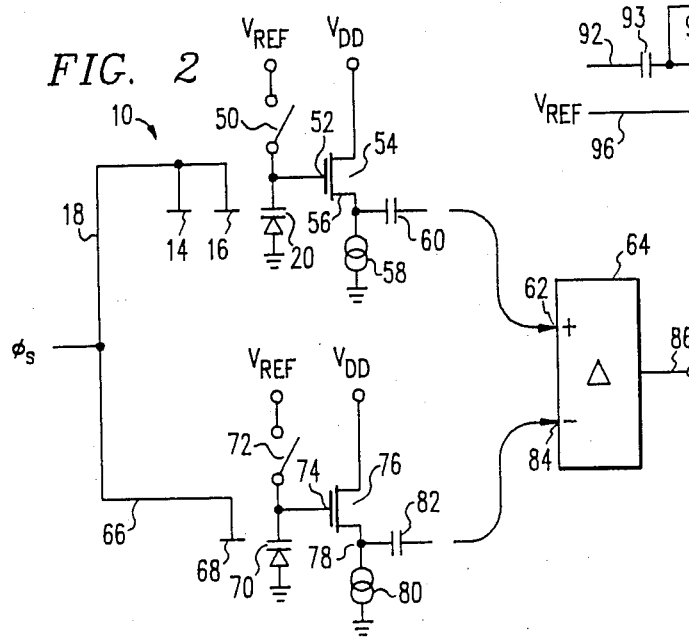
FIG. 2 is a simplified electrical schematic diagram of an AC-coupled differential output amplifier for a CCD register according to the invention.

A circuit solving this problem is schematically illustrated in FIG. 2. In FIG. 2, like numbers identify elements like those in FIG. 1 wherever possible. The last well 16 of serial CCD output register 10 is coupled to CCD detection node 20. Node 20 is reset to a voltage reference $V_{REF}$ through a reset switch 50, which can be a MOS transistor such as transistor 24 in FIG. 1. Detection node 20 is also coupled to a gate 52 of an amplifier transistor 54. Transistor 54 has a drain connected to voltage supply $V_{DD}$ and a source 56 that is connected to a constant current source 58. A coupling capacitor 60 couples source 56 to a positive input 62 of a differential input amplifier stage 64.

Signal $\phi_s$ is also communicated via a line 66 to a dummy CCD channel 68. Dummy channel 68 is coupled to a dummy detection node 70 that does not sense any signal charge. Detection node 70 is reset with the aid of a resetter 72, and is further coupled to a gate 74 of transistor 76. As in transistor 54, transistor 76 has a drain connected to voltage supply $V_{DD}$, and a source 78 coupled to a constant current source 80. Source 78 is further coupled via a coupling capacitor 82 to a negative input terminal 84 of differential amplifier 64.

Differential amplifier 64 amplifies the difference between the positive input 62 and the negative input 84, thereby rejecting the common signal caused by the CCD clock $\phi_s$. An amplified differential signal is output at an output 86.

In an alternative embodiment (not shown), transistor 54 can be replaced with a double source follower circuit of two transistors between detection node 20 and coupling capacitor 60. A dual source follower circuit would be used to increase the drive capability in order to drive a large coupling capacitor 60. A similar double source follower circuit would be inserted between dummy detection node 70 and coupling capacitor 82 in place of the single transistor 76 shown.

Figure 3:
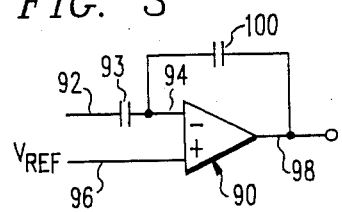
FIG. 3 is a simplified electrical schematic diagram of a low-noise feedback amplifier stage according to the invention.

FIG. 3 illustrates a preferred type of amplifier to be used with the invention, which is indicated generally at 90. A signal source 92 is capacitively coupled by capacitor 93 to a negative input 94 of amplifier 90. A positive input is provided on line 96. Amplifier 90 has an output 98. Output 98 is capacitively coupled by a feedback capacitor 100 to negative input 94.

The negative feedback through capacitor 100 reduces the noise generated inside of the amplifier. Substantially, noiseless capacitors 93 and 100 are provided instead of resistors to obviate the noise generated by such resistors.

The amplifier illustrated in FIG. 3 is not stable in DC operation. However, this is not a problem in CCD image sensor applications, since the processed signal is always an AC signal. As will be described in conjunction with FIG. 5 below, the amplifier is periodically reset in correlation with the charge transport clock $\phi_s$ to periodically establish a suitable operating point.

Returning momentarily to FIG. 2, a conventional differential amplifier stage can be used for amplifier 64. Although not shown, such a conventional amplifier stage would include a differential transistor pair having their sources connected in common to a constant current source, and their drains connected through respective load resistances to a voltage supply. The output would then be taken off the drain of one or the other of the differential pair.

Figure 4:
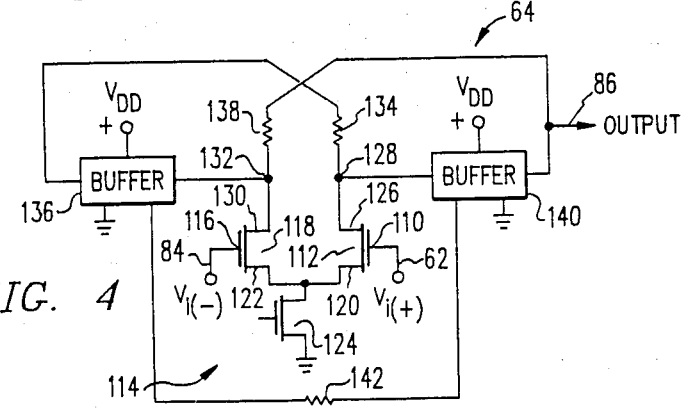
FIG. 4 is a simplified electrical schematic diagram of a differential amplifier employing a differential pair, buffers and cross-coupled load impedances.

However, this commonly employed design does not provide enough gain per stage for many applications. Therefore, it is preferred that amplifier 64 be of the configuration shown in the simplified schematic diagram of FIG. 4. In FIG. 4, like numbers identify like elements introduced in previous figures where possible. A preferred differential amplifier is indicated generally at 64 and can be used in conjunction with the single-ended signal and dummy stages shown in FIG. 2. Positive branch signal input 62 is connected to a gate 110 of a first transistor 112 of a differential pair indicated generally at 114. Negative branch input 84 is connected to a gate 116 of a second transistor 118 of differential pair 114. The respective sources 120 and 122 of transistors 112 and 118 are connected in common to a drain of a small transistor 124 which acts as a constant current source.

A drain 126 of positive branch transistor 112 is connected to a node 128. Likewise, a drain 130 of negative branch differential transistor 118 is connected to a node 132. A first load resistor 134 is connected between node 128 and a buffer 136. A second load resistor 138 is connected between node 132 and a second buffer 140.

Buffer 136 is further connected to node 132, and buffer 140 is further connected to node 128. Buffers 136 and 140 are connected to voltage supply $V_{DD}$, as shown. Buffers 136 and 140 are interconnected through a feedback resistor 142.

Amplifier 64 as shown in FIG. 4 uses a positive feedback to bootstrap the bias point for load resistors 134 and 138 to provide a high gain. This bootstrapping principle enhances the value of the low intrinsic resistance appearing at nodes 128 and 132 to an arbitrarily high number, thereby increasing the gain of the differential stage. A gain of approximately 20 is thus generated in a single stage so that a negative feedback loop can be closed and an amplifier gain of three to five times can be effectively obtained. The gain of the amplifier in FIG. 4 is dependent only on the values of feedback capacitors (not shown, see FIGS. 3 and 5), which capacitors are not sensitive to process parameters or temperature. The capacitance ratio of these capacitors to the coupling capacitors (not shown, see FIGS. 3 and 5) on the input lines that determines the gain, is constant.

The circuit shown in FIG. 4 does not have to have DC stability, as has been previously discussed. A resetter (not shown, see transistor 210 in FIG. 5) should be provided between nodes 128 and 132 to periodically equalize these two nodes to provide stability of the amplifier.

Figure 5:
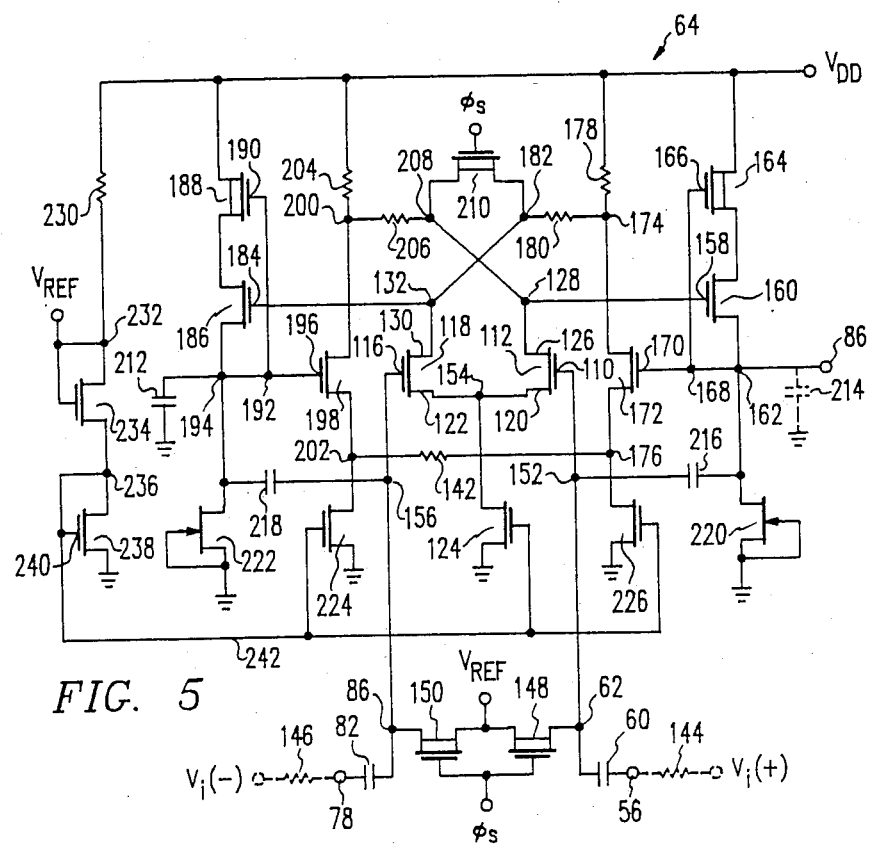
FIG. 5 is a detailed electrical schematic diagram illustrating a preferred differential amplifier stage according to the invention.

A more detailed schematic electrical diagram of a preferred differential amplifier stage is shown in FIG. 5. In FIG. 5, like numbers identify elements introduced in previous figures wherever possible.

An input signal that contains both a differential signal component and a common mode component is input at a node 56. The impedance of a previous stage, which can be a linear stage as shown in FIGS. 1 or 2, is modelled at 144. A coupling capacitor 60 couples node 56 to a node 62.

A signal that consists of the common mode signal only is input at a node 78. This common signal is coupled by a coupling capacitor 82 to a node 86. An impedance to model the effect of the dummy stage shown in FIG. 2 is shown at 146 in FIG. 5.

A resetting transistor 148 is provided to periodically reset node 62 to a voltage reference $V_{REF}$, and likewise a resetting transistor 150 is provided to periodically reset a node 86 to voltage reference $V_{REF}$. Transistors 148 and 150 are controlled by a pulse source $\phi_S$ and can be of the buried channel type.

Signal node 62 is connected to a node 152, which in turn is connected to a gate 110 of a positive circuit branch transistor 112. Transistor 112 and a negative circuit branch transistor 118 form a first differential pair. A source 120 of transistor 112 and a source 122 of transistor 118 are connected in common at a node 154. Node 154 is connected via a constant current source transistor 124 to ground.

Negative circuit branch input signal node 86 is connected to a node 156. Node 156 is further connected to a gate 116 of negative branch transistor 118. A drain 130 of transistor 118 is connected to a negative branch output node 132 of the first differential pair, while the drain 126 of transistor 112 is connected to a positive branch node 128 of the first differential pair.

Output node 128 is connected to a gate 158 of a buffer transistor 160. The source of buffer transistor 160 is connected to a node 162, while the drain of buffer transistor 160 is connected to the source of a preferably buried-channel transistor 164. The drain of transistor 164 is in turn connected to a voltage supply $V_{DD}$. Its gate 166 is connected to a node 168. Node 168 is connected to an external output node 86 of differential amplifier 64, and also to a gate 170 of a transistor 172.

The drain of transistor 172 is connected to a node 174, while the source of transistor 172 is connected to a node 176. Node 174 is connected by a resistor 178 to voltage supply $V_{DD}$. A resistor 180 connects node 174 to a node 182. Node 182 is cross-connected to node 132 on the negative branch of the first differential pair.

Node 132 is connected to a gate 184 of a buffer transistor 186. The drain of transistor 186 is connected to the source of a preferably buried-channel transistor 188, whose drain is in turn connected to a voltage supply $V_{DD}$. A gate 190 of buried channel transistor 188 is connected to a node 192. The source of transistor 186 is connected to a node 194.

Nodes 192 and 194 are connected together and to a gate 196 of a transistor 198. Transistors 172 and 198 form a second differential pair or stage of amplifier 64. The drain of transistor 198 is connected to a node 200, while the source of transistor 198 is connected to a node 202. Node 202 is connected via a feedback resistor 142 to node 176 on the positive branch of the differential circuit.

Node 200 is connected via a load resistor 204 to voltage supply $V_{DD}$ and is further connected by a load resistor 206 to a node 208. Node 208 is cross-connected to node 128 on the positive branch of the circuit.

Node 182 and node 208 are connected by the current path of a resetting transistor 210. The gate of resetting transistor 210 is controlled by pulse source $\phi_S$. Resetting transistor 210 is preferably a buried-channel transistor, as shown.

Node 194 is further connected to a dummy load capacitor 212. Dummy load capacitor 212 is provided to offset the equivalent load of the next stage, which is modelled at 214 on the positive side of the circuit. Capacitor 214 is connected to external output node 86.

It is also possible to take an output signal of opposite polarity from node 194 in the left branch of the circuit. In this instance, dummy capacitor 212 is disconnected from node 194 and connected to node 162 on the right-hand side of the circuit.

A negative feedback capacitor 216 on the positive branch of the circuit connects node 162 to positive input node 152. Likewise, a negative feedback capacitor 218 connects node 194 to negative branch input node 156.

Nodes 162, 176, 154, 202, and 194 are connected to ground through various constant current sources. Node 162 is connected to ground via a small transistor 220, which is preferably a virtual well JFET transistor as shown. On the negative branch of the circuit, a virtual well JFET transistor 222 likewise connects node 194 to ground. A small transistor 224 has a current path that connects node 202 to ground, and a small transistor 226 has a current path that connects node 176 to ground.

On the left-hand side of the circuit, a bias resistor 230 connects a node 232 to voltage supply $V_{DD}$. Node 232 is further connected to a voltage reference $V_{REF}$ and also to a drain of a first biasing transistor 234. The source of transistor 234 is connected to a node 236. Node 236 is connected to the drain of a transistor 238. The current path of transistor 238 connects node 236 to ground.

Node 236 is also connected to a gate 240 of transistor 238, and is further connected to the gates of transistors 224, 124 and 226 through a line 242.

Transistors 234, 238, 222, 224, 124, 226 and 220 operate as an amplifier bias network in conjunction with bias resistor 230. The DC bias of the network is set by the value of resistor 230 and the sizes of the transistors in the network.

Transistors 164, 160, differential pair 198 and 172, and load resistor 178 together comprise a positive branch buffer stage that is operable to generate the bootstrap effect. Transistor 186 and 188 in conjunction with load resistor 204, and the same differential pair 198 and 172 form a corresponding negative branch buffer stage.

The operation of output amplifier 64 as shown in FIG. 5 can be best explained by way of an example. Suppose that a small positive differential signal appears at gate 110 of transistor 112. This will increase the current between node 128 and node 154, and will therefore decrease the voltage present at nodes 128 and 208. A decrease in voltage at node 128 also reduces the voltage on gate 158 of positive branch buffer transistor 160, and therefore decreases the voltage at node 162 and output node 86. A voltage decrease at node 162 decreases the voltage at gate 170 of positive branch differential transistor 172, thereby causing the voltage drop across transistor 172 to increase.

A decrease in voltage at gate 170 will therefore translate into an increase of voltage at second positive branch output node 174. This will translate into an increase of voltage at first negative branch output node 132 and at gate 184 of negative branch buffer transistor 186. An increase of the voltage on gate 184 will increase the current through transistor 186, and will cause an increase in the voltage at gate 196 of second negative differential transistor 198. This in turn will cause an increase in current passing through transistor 198, and will lower the voltage at second negative branch output node 200. The values of resistors 206, 204 and 142 are selected such that the decrease in voltage at node 208 matches the decrease in voltage at node 200. Therefore, the effective impedance seen at node 208 and node 128 can be made to be very large, thus increasing the gain of the circuit.

CCD clock pulse source $\phi_S$ is used to periodically equalize nodes 182 and 208 and also to reset nodes 62 and 86 to a voltage reference $V_{REF}$. This periodic reset maintains stability of amplifier 64.

The circuit shown in FIG. 5 is basically a double differential pair with associated buffer transistors and cross-coupled load impedances 180 and 206. The current passing through transistor 226 from node 176 is constant. Therefore, if there is a decrease in current passing through transistor 172, this will reflect a change in the gate-to-source bias of transistor 198. The interaction of transistors 172 and 198 therefore amplifies the differential signal. It has been determined that the optimum ratio of resistance values of resistors 178 and 180, and the corresponding ratio of resistor values 204 and 206, is one.

The gain of the amplifier is determined by the ratio of input coupling capacitor 60 to feedback capacitor 216, as modelled to include transistor intrinsic capacitances. This ratio is matched by the ratio of capacitance of negative branch signal coupling capacitor 28 to negative branch negative signal feedback capacitor 218. These capacitance ratios are fixed by design and are process-insensitive. The gain of the bootstrapping buffer, for the negative branch buffer consisting of transistors 190, 184 and resistor 204, is determined by the resistance ratio of resistor 178 or 204 to feedback resistor 142. This bootstrapping buffer gain is therefore able to be fixed by design and is process-insensitive. Finally, the bias point of the amplifier is also fixed by the ratio of the value of load resistor 178 (or load resistor 204) divided by the value of bias resistor 230. The values of the elements on the positive and negative branches of the circuit match. Thus, all important parameters of amplifier stage 64 are insensitive to process variations.

Transistors 164 and 188 are preferred to be inserted into the circuit between the voltage supply and the drain of respective buffer transistors 160 and 186, but are not absolutely necessary. They are provided in the preferred circuit to limit the voltage drop across respective buffer transistors 160 and 186, and therefore to limit the hot carrier noise generated by these transistors.

In summary, an AC-coupled two-stage differential amplifier has been provided for CCD imagers that employs a cross-coupled feedback to increase its intrinsic open-loop gain. The 1/f noise contribution has been minimized by using a dual source follower scheme with AC coupling to the subsequent stages. In the differential amplifier, a second differential transistor pair is cross-coupled to a first differential transistor pair by means of load resistors whose values are selected such that the voltage drop across them will remain substantially constant, thereby increasing the intrinsic gain. Negative feedback capacitors are used to couple the outputs of the differential amplifier to the inputs thereof instead of resistors to further reduce noise.

While preferred embodiments of the invention and their advantages have been disclosed in the above detailed description, the invention is not limited thereto but rather only by the scope and spirit of the appended claims.

What is claimed is:

1. A low 1/f noise output amplifier for a chopped AC signal comprising:
   a first stage signal circuit receiving a signal having a differential portion and a common portion, said signal circuit having a differential circuit for receiving said differential portion coupled to a common circuit for receiving said common portion;
   a second stage signal circuit having a negative branch circuit producing a first output and coupled to a positive branch circuit producing a second output, said negative branch receiving an output of said common circuit and said positive branch receiving an output of said differential circuit, a first feedback circuit coupling said second output to said output of said differential circuit, a second feedback circuit coupling said first output to said output of said common circuit;
   a resetter operable to reset said differential portion and said common portion to a voltage reference;
   a first AC coupling element coupled between said differential circuit and said positive branch circuit; and
   a second AC coupling element coupled between said common circuit and said negative branch circuit.

2. The output amplifier of claim 1, wherein a feedback capacitor is connected between an output of said second stage signal circuit and the output of said common circuit.

3. The output amplifier of claim 1, wherein said second stage signal circuit further includes a second differential pair having a positive circuit branch and a negative circuit branch, an input of said positive branch of said second differential pair coupled to an output of said negative branch of said first differential pair, an input of said negative branch of said second differential pair coupled to an output of said positive branch of said first differential pair.

4. A low 1/f noise differential amplifier for amplifying a chopped AC signal comprising:
   a first input node for inputting a combined signal consisting of a common component and a differential component;
   a second input node for inputting a signal consisting of said common component;
   a first differential pair for receiving inputs from said first and second input nodes, said first differential pair coupled to a negative circuit branch producing a first output and a positive circuit branch producing a second output;
   an external output coupled to one of said first and second outputs;
   a second differential pair coupled to a second negative circuit branch producing a third output and a second positive circuit branch producing a fourth output, a first buffer transistor coupled between said first output and said second negative circuit branch, a second buffer transistor coupled between said second output and said second positive circuit branch;
   a first load coupled between said third output and said second output, a second load coupled between said fourth output and said first output;
   a resetter operable to equalize voltages at the first and second outputs;
   a first feedback circuit including a first capacitor coupled between said first output and said first input node; and
   a second feedback circuit including a second capacitor coupled between said second output and said second input node.

5. The differential amplifier of claim 4 including a second resetter for resetting said first and second input nodes to a voltage reference.

6. The differential amplifier of claim 4, wherein said first differential pair comprises first and second transistors, said transistors each having a gate, source and drain, said sources of said first and second transistors coupled to a constant current source, the gate of said first transistor coupled to said first input node, the gate of said second transistor coupled to said second input node;

said second differential pair comprising third and fourth transistors each having a gate, source and drain, the sources of said third and fourth transistors coupled together through a feedback impedance and each coupled to a constant current source, the gate of said third transistor coupled to the drain of said first transistor, the gate of said fourth transistor coupled to the drain of said second transistor;

the drain of said third transistor cross-coupled to the drain of said second transistor through a first load impedance, the drain of said fourth transistor cross-coupled to the drain of said first transistor through said second load impedance.

7. The differential amplifier of claim 6, and further comprising a third load impedance connected between said drain of said third transistor and a voltage supply, a fourth load impedance connected between said drain of said fourth transistor and said voltage supply.

8. The differential amplifier of claim 7, wherein said first and second feedback circuits each comprise feedback elements, the values of said elements selected such that the voltage drops across said first load impedance and said second load impedance will remain substantially constant during the operation of said amplifier, such that the effective impedances at the drains of said first and second transistors will be large and the gain of said amplifier will be enhanced.

9. The amplifier of claim 6, and further comprising:
a first buffer transistor having a gate, source and drain, said drain of said first buffer transistor coupled to a voltage supply, said gate of said first buffer transistor coupled to said drain of said first transistor, said source of said first buffer transistor coupled to the gate of said third transistor;
a second buffer transistor having a gate, source and drain, said gate of said second buffer transistor coupled to said drain of said second transistor, said drain of said second buffer transistor coupled to said voltage supply, said source of said second buffer transistor coupled to said gate of said fourth transistor.

10. The amplifier of claim 9, and further comprising a bias circuit for controlling the conductance of selected ones of said constant current sources, each constant current source comprising a transistor having a source coupled to ground and a gate, a control line of said bias circuit coupling a plurality of gates of said selected ones to a voltage reference.

11. The amplifier of claim 4, including a dummy load capacitor coupled between said second negative circuit branch and a potential source for balancing the capacitance of external circuitry coupled to said external output.

12. A low 1/f noise output amplifier comprising:
a detection node for detecting and storing a signal;
a first stage receiving as input said signal stored by said detection node and having an output;
a second stage having an input and an output, an AC coupling element coupling said output of said first stage to said input of said second stage;
a voltage reference source;
a first resetter coupled between said voltage reference source and said detection node for resetting said detection node to said voltage reference; and
a second resetter coupled between said voltage reference source and said input of said second stage for resetting said AC coupling element to said voltage reference, said first and second resetters operated by a transfer clock pulse of a storage device coupled to said detection node.

13. A low 1/f noise output amplifier comprising:
a detection node for receiving and storing a first input signal comprising a differential portion and a common portion, a dummy detection node for receiving and storing a second input signal comprising said common portion, aid detection node coupled to a storage element output, said dummy detection node coupled to a dummy storage element output;
detection and dummy detection node resetters for respectively resetting said detection and dummy detection nodes to a voltage reference;
a signal stage having an input coupled to said detection node and an output
a dummy stage having an input coupled to said dummy detection node and an output; and
a differential amplifier having positive and negative inputs and a differential output, a first AC coupling element coupling said positive input to said output of said signal stage, a second AC coupling element coupling said negative input to said output of said dummy stage.

14. A method for amplifying an output signal comprising:
receiving a signal from a storage element at a signal detection node, said signal having a differential portion and a common portion;
coupling the signal detection node to a signal amplifier stage;
inputting said common portion of said signal to a dummy detection node;
coupling the dummy detection node to a dummy amplifier stage;
coupling an output of the signal amplifier stage to a positive input of a differential amplifier via a first AC coupling element;
coupling an output of the dummy amplifier stage via a second AC coupling element to a negative input of the differential amplifier;
generating a differential output based on the difference between the positive and negative inputs; and
periodically resetting the positive and negative inputs to a voltage reference.

* * * * *